ated under 35

United States Patent
Born et al.

(10) Patent No.: US 11,573,593 B2
(45) Date of Patent: Feb. 7, 2023

(54) LEVEL-BASED DROOP DETECTION (71) Applicant: ADVANCED MICRO DEVICES, INC., Santa Clara, CA (US)

(72) Inventors: Richard Martin Born, Fort Collins, CO (US); Stephen Victor Kosonocky, Fort Collins, CO (US); Miguel Rodriguez, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 432 days.

(21) Appl. No.: 15/954,051

(22) Filed: Apr. 16, 2018

(65) Prior Publication Data
US 2019/0317546 A1   Oct. 17, 2019

(51) Int. Cl.
| | | |
|---|---|---|
| G06F 1/00 | (2006.01) |
| G06F 11/30 | (2006.01) |
| G06F 1/08 | (2006.01) |
| G06F 1/30 | (2006.01) |
| G06F 1/28 | (2006.01) |
| H03K 5/00 | (2006.01) |

(52) U.S. Cl.
CPC ............ *G06F 1/08* (2013.01); *G06F 1/28* (2013.01); *G06F 1/305* (2013.01); *H03K 5/00006* (2013.01)

(58) Field of Classification Search
CPC ... G06F 1/08; G06F 1/305; G06F 1/28; G06F 1/324; H03K 5/00006
See application file for complete search history.

(56) References Cited

U.S. PATENT DOCUMENTS

| | | | | |
|---|---|---|---|---|
| 2004/0119521 A1* | 6/2004 | Kurd | ......................... | G06F 1/10 |
| | | | | 327/291 |
| 2009/0144578 A1* | 6/2009 | Tatsumi | .................. | G06F 1/324 |
| | | | | 713/340 |
| 2012/0187991 A1 | 7/2012 | Sathe et al. | | |
| 2016/0072491 A1* | 3/2016 | Bowman | ................ | H03K 5/156 |
| | | | | 327/276 |
| 2016/0291625 A1* | 10/2016 | Tripathi | ..................... | G06F 1/28 |
| 2017/0061568 A1* | 3/2017 | Metz | ....................... | G06F 1/206 |
| 2018/0284878 A1* | 10/2018 | Artieri | ..................... | G06F 1/189 |
| 2019/0288681 A1* | 9/2019 | Bang | .................... | H03K 17/284 |

* cited by examiner

*Primary Examiner* — Xuxing Chen (57) ABSTRACT

A power regulator provides current to a processing unit. A clock distribution network provides a clock signal to the processing unit. A level-based droop detector monitors a voltage of the current provided to the processing unit and provides a droop detection signal to the clock distribution network in response to the voltage falling below a first threshold voltage. The clock distribution network decreases a frequency of a clock signal provided to the processing unit in response to receiving the droop detection signal. The level-based droop detector interrupts the droop detection signal that is provided to the clock distribution network in response to the voltage rising above a second threshold voltage. The clock distribution network increases the frequency of the clock signal provided to the processing unit in response to interruption of the droop detection signal.

20 Claims, 8 Drawing Sheets

LEVEL-BASED DROOP DETECTION

BACKGROUND

Processing units consume a variable amount of power depending on the processes that are executing on the processing unit. A processing unit consumes very little power while in the idle state, but power consumption increases rapidly when the processing unit is required to perform an action. For example, the power consumption of a processing unit increases quickly in response to receiving a signal generated by a mouse in response to a user moving the mouse. Power regulators that supply power to the processing unit don't react instantaneously to the change in the current drawn by the processing unit, e.g., due to lags in detecting the increase in power, inductances in the power supply or processing circuits, die parasitics, and the like. The reaction delay at the power regulators causes the voltage supplied to the processing unit to decrease, or droop, relative to a target voltage until the power regulator is able to adjust and supply a higher current at the target voltage. Droops persist for different amounts of time depending on the source of the droop. The first droop is caused by small inductances and lasts for time intervals on the order of nanoseconds (e.g., a few clock cycles), second droops are caused by package inductances and last for time intervals on the order of microseconds, and third droops caused by inductances in the power regulator take milliseconds to resolve.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

A processing unit requires a minimum voltage to operate at its nominal frequency. For example, some processing units require at least 500 millivolts (mV) to operate at a nominal frequency of 2 gigahertz (GHz). A mismatch between the provided clock frequency and the operational frequency of the processing unit occurs if the voltage supplied to the processing unit drops below the minimum voltage. For example, if the voltage supplied to the processing unit droops below the 500 mV minimum voltage, the operating frequency of the processing unit falls below the 2 GHz clock signal provided by the clock network. One strategy for avoiding a mismatch between the clock frequency and the operating frequency of the processing unit during droops is to add voltage headroom to ensure that the drooping voltage doesn't fall below the minimum voltage. For example, a voltage of 600 mV can be supplied to the processing unit so that droops of up to 100 mV do not cause the supplied voltage to drop below 500 mV. However, adding voltage headroom increases the overall power dissipated by the processing unit. Most of the additional power is wasted because the voltage headroom is only necessary during the relatively short time intervals needed to resolve the droop. Excess power dissipation also degrades metrics such as the performance/watt of a processing unit, as well as making it more difficult to satisfy thermal constraints on devices such as smart phones, laptops, servers, exascale computers, and the like.

Stretch logic is used to avoid a mismatch between a clock frequency and an operating frequency of a processing unit by reducing the clock frequency in response to detecting droops. A conventional droop detector monitors a rate of change (or slope) of a voltage provided to a processing unit and generates a signal indicating a voltage droop in response to the slope exceeding a threshold value. However, conventional droop detectors have significant drawbacks. First, a slope-based droop detector identifies a voltage droop regardless of the actual value of the voltage that is being supplied to the processing unit. The slope-based droop detector can therefore signal a voltage droop even if the actual voltage has not fallen below the minimum voltage. The slope-based droop detector will also fail to detect voltage droops that occur too gradually to exceed the slope threshold. Second, a slope-based droop detector requires an averaging circuit to generate an average value of the supplied voltage, which is then used to determine the slope of the supply voltage. A voltage averaging circuit is typically configured to average the voltage over a predetermined time scale. Voltage averaging circuits that are able to monitor average voltages on multiple timescales—such as the nanosecond, microsecond, and millisecond timescales of different types of droops—are significantly more complicated to implement. Third, conventional droop detectors receive the same clock signal as the logic in the voltage domain that they are monitoring. Thus, the clock signal provided to the conventional droop detector slows down in response to the droop, which prevents the conventional droop detector from detecting droops.

FIGS. 1-8 disclose a level-based droop detector that detects voltage droops in a processing system over a wide range of timescales, while also reducing erroneous detections. The level-based droop detector generates a droop detection signal in response to a voltage provided to a processing unit dropping below a voltage threshold. The droop detection signal is provided to a clock distribution network (e.g., a clock mesh), which decreases a clock frequency that is provided to the processing unit as long as the droop detection signal indicates that the voltage provided to the processing unit is below the voltage threshold. Some embodiments of the clock distribution network include a phase locked loop to provide a fixed rate clock signal and a digital frequency synthesizer to provide a variable rate clock signal by modifying the fixed rate clock signal. For example, the digital frequency synthesizer can be configured to provide the variable rate clock signal at a first frequency based on a first number of oscillations between a high phase and a low phase provided by the phase locked loop. In response to the droop detection signal indicating that a voltage droop is occurring, the digital frequency synthesizer decreases the variable rate clock signal to a second frequency (lower than the first frequency) by increasing the number of oscillations between the high and low phases provided by the phase locked loop that are used to generate the variable rate clock signal. Some embodiments of the processing system include multiple power domains and implement multiple level-based droop detectors to detect voltage droops in corresponding power domains. Modifications of the variable rate clock signals provided to the power domains are performed independently in some cases and are partially synchronized in other cases, e.g., if one domain includes a cache and another domain includes a processing unit that expects the values in the cache to be available when the processing unit needs to access the values.

Figure 1:
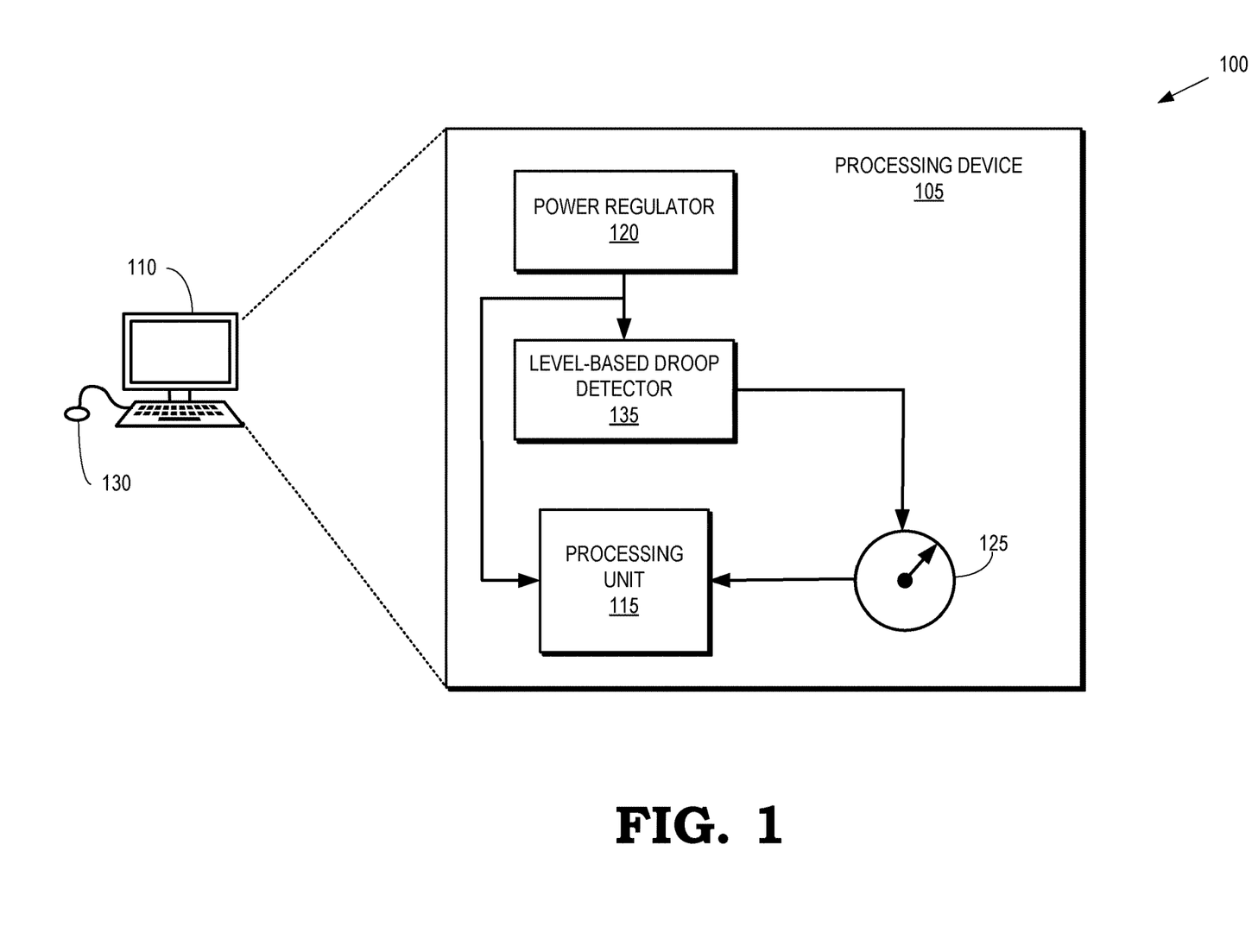
FIG. 1 is a block diagram of a processing system according to some embodiments.

FIG. 1 is a block diagram of a processing system 100 according to some embodiments. The processing system 100 includes a processing device 105 that is implemented in a package 110 such as a desktop computer, a laptop computer, a tablet computer, a smart phone, and the like. The processing device 105 includes one or more processing units 115 that are configured to execute programs or applications. The processing units 115 are also referred to as processors or processor cores in some cases. A power regulator 120 is used to provide power to the processing unit 115. Some embodiments of the power regulator 120 provide current at a predetermined or nominal voltage such as 500 mV. The current is drawn by the processing unit 115, which uses the power provided by the power regulator 120 to execute the programs or applications.

The processing device 105 also includes one or more clock distribution networks 125 that provide clock signals to the processing unit 115. The clock signals are represented by a voltage that oscillates between a low voltage level and a high voltage level at a particular frequency. The processing device 105 therefore executes the operations defined by the programs or applications at a frequency that corresponds to the frequency of the clock signal, e.g., by performing operations on a rising edge or a falling edge of the clock signal. In some embodiments, a nominal frequency of the clock signal corresponds to an operating frequency of the processing device 105 that is powered at the nominal voltage provided by the power regulator 120.

The processing unit 115 consumes a variable amount of power depending on the processes that are executing on the processing unit 115. Some embodiments of the processing unit 115 consume very little power when operations are not being performed by the processing unit 115, e.g., when the processing unit 115 is in an idle state. However, the processing unit 115 increases its power consumption in order to perform operations such as moving a cursor on a display in response to movement of a mouse 130. The power regulator 120 is not able to react instantaneously to the change in the current drawn by the processing unit 115, e.g., due to lags in detecting the increase in power, inductances in the power supply or processing circuits, die parasitics, and the like. The voltage supplied to the processing unit 115 therefore decreases, or droops, relative to the nominal voltage until the power regulator 120 adjusts to the new level of current being drawn by the processing unit 115. The droop persists for different amounts of time depending on the source of the droop. In some embodiments, a first droop in the voltage supplied by the power regulator 120 is caused by small inductances and lasts for time intervals on the order of nanoseconds (e.g., a few clock cycles), a second droop in the voltage is caused by package inductances and last for time intervals on the order of microseconds, and a third droop in the voltage caused by inductances in the power regulator take milliseconds to resolve.

The processing device implements a level-based droop detector 135 to detect droops on different timescales and provide droop detection signals that are used to trigger adjustments in the frequency of the clock signal provided by the clock distribution network 125. Some embodiments of the level-based droop detector 135 are configured to monitor the voltage provided to the processing unit 115 by the power regulator 120. The level-based droop detector 135 provides a droop detection signal to the clock distribution network 125 in response to the voltage falling below a level defined by a threshold voltage. The clock distribution network 125 is configured to decrease a frequency of the clock signal provided to the processing unit 115 in response to receiving the droop detection signal. The level-based droop detector 135 is also configured to interrupt the droop detection signal that is provided to the clock distribution network 125 in response to the voltage rising above a second threshold voltage. The first and second threshold voltages are the same in some cases or they are configured to have different values to provide a hysteresis in the droop detection process, e.g., by setting the second threshold voltage to a higher voltage than the first threshold voltage. The clock distribution network 125 is configured to increase the frequency of the clock signal provided to the processing unit 115 in response to interruption of the droop detection signal.

Figure 2:
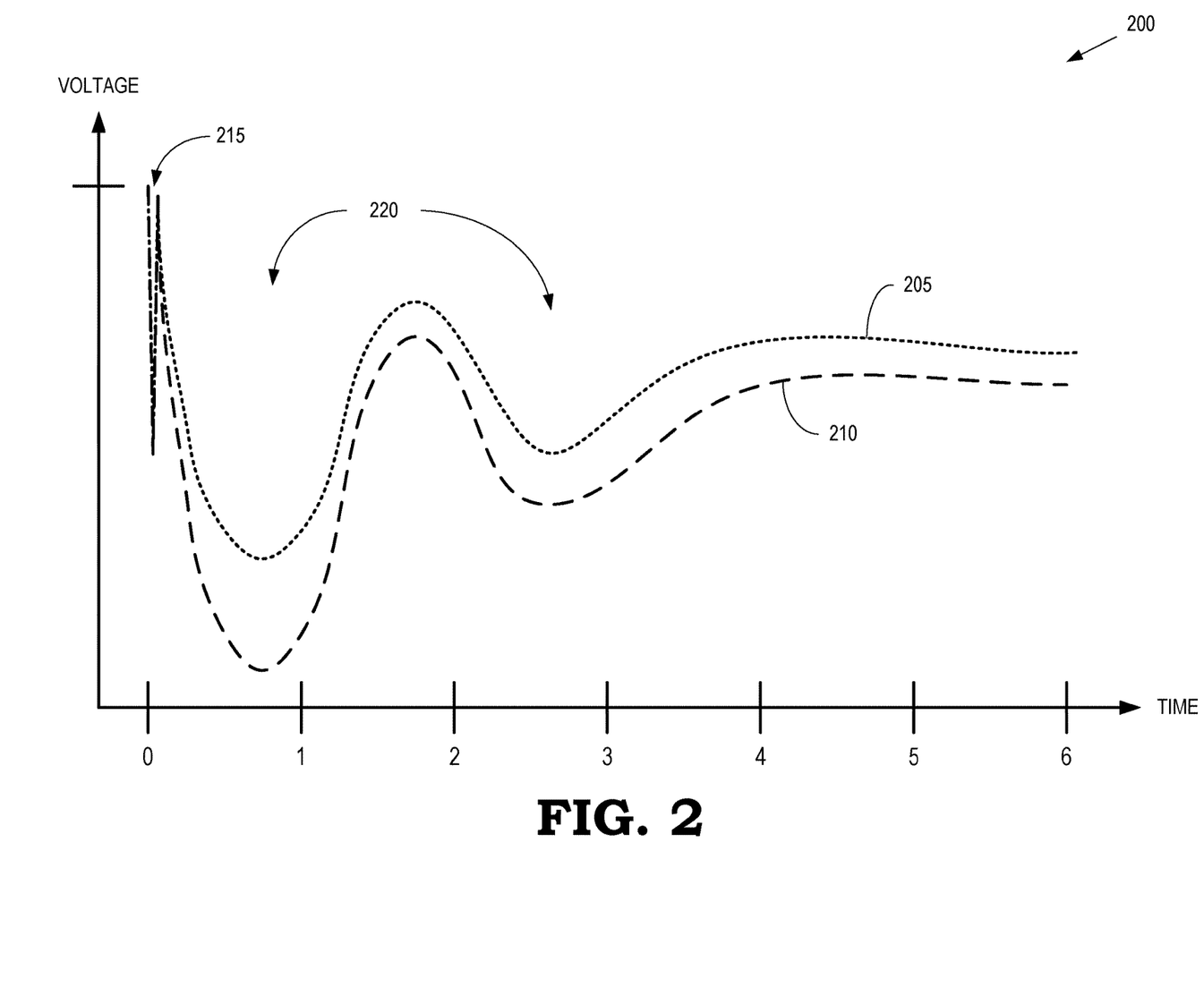
FIG. 2 is a plot of a voltage provided by a power regulator in response to an event that causes a processing unit to begin executing instructions according to some embodiments.

FIG. 2 is a plot 200 of a voltage provided by a power regulator in response to an event that causes a processing unit to begin executing instructions according to some embodiments. The plot 200 represents a voltage provided by some embodiments of the power regulator 120 shown in FIG. 1. The vertical axis indicates a voltage in arbitrary units and the horizontal axis indicates time in microseconds. A load step representing a change in a current drawn by the processing unit occurs at T=0 in the illustrated embodiment of the plot 200. The curve 205 represents a voltage supplied following a 10 amp change in the current drawn by a processing unit such as the processing unit 115 shown in FIG. 1. The curve 210 represents a voltage supplied following a 14 amp change in the current drawn by the processing unit.

First droops 215 occur in the curves during a relatively short time interval following the load step. In the illustrated embodiment, the first droops 215 occur on a timescale on the order of nanoseconds, although the durations of the first droops 215 are exaggerated in FIG. 2 in the interest of clarity. The curve 205 shows a slightly smaller first droop 215 than the curve 210. The difference in the amplitudes of the first droop 215 in the curves 205, 210 is a result of the different current changes or the corresponding load steps. Second droops 220 occur over a longer time interval following the load step. In the illustrated embodiment, the second droops 220 occur on a timescale on the order of microseconds. The second droops 220 also occur in two portions as the power regulator attempts to provide current to the processing unit at a stable voltage. The curve 205 shows a slightly smaller second droop 220 than the curve 210 due to the difference in the amplitudes of the corresponding load steps. In some embodiments, third droops (not shown in FIG. 2 in the interest of clarity) occur over a relatively longer time interval than the second droops 220. For example, third droops can occur on timescales of milliseconds or longer.

Figure 3:
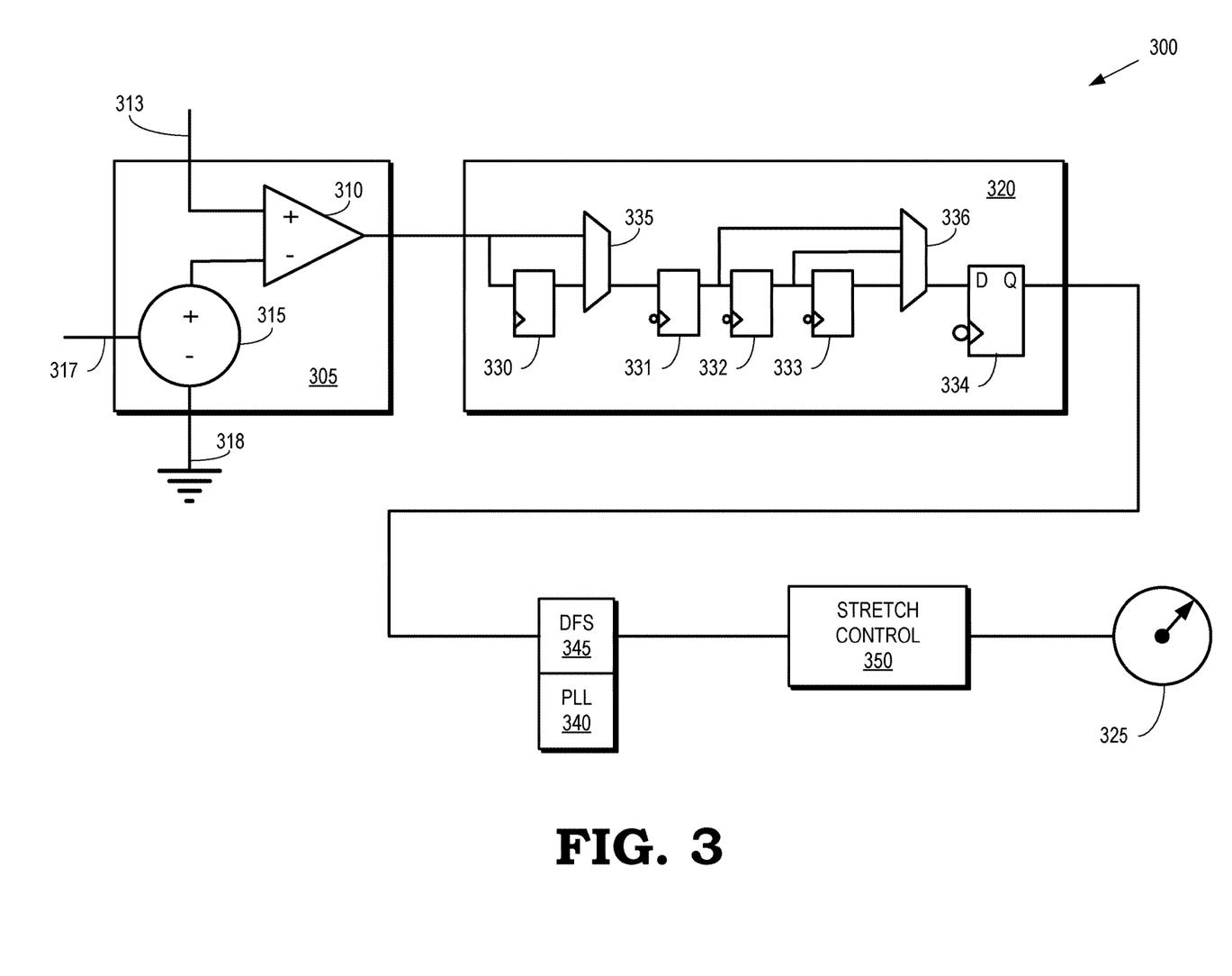
FIG. 3 is a block diagram of a droop detection and mitigation circuit according to some embodiments.

FIG. 3 is a block diagram of a level-based droop detection and mitigation circuit 300 according to some embodiments. The circuit 300 uses level-based droop detection and is implemented in some embodiments of the processing device 105 shown in FIG. 1. The circuit includes a droop detection circuit 305 that compares an input voltage (such as a voltage provided by the power regulator 120 shown in FIG. 1) to a threshold voltage.

Some embodiments of the level-based droop detection circuit 305 include a comparator 310 that is connected to a power rail that provides the input voltage 313. The comparator 310 could connect to the power rail through a resistor divider so that the measured voltage remains below a voltage used in the level-based droop detection circuit 305. Some embodiments of the level-based droop detection circuit 305 include a voltage source 315 that establishes the threshold voltage for comparison with the input voltage, i.e., the voltage source 315 establishes the level of the voltage that is compared to the input voltage to detect droops. For example, the voltage source 315 generates the threshold voltage using a digital-to-analog converter such as a delta-sigma type converter to ensure that the threshold voltage maintains a steady value that does not droop in response to changes in the input voltage. The threshold voltage is set using a signal 317 and the voltage source 315 is connected to ground 318. In some cases, the threshold voltage is provided using a fixed bias current via a precision resistor. Some embodiments of the voltage source 315 in the level-based droop detection circuit 305 determine the threshold voltage using a two-point calibration that assumes a linear response between two threshold voltage values that are saved to fuses and are used to program the actual threshold voltage value at a value intermediate between the threshold values stored by the fuses.

The level-based droop detection circuit 305 provides a droop detection signal based on the comparison of the level of the input voltage 313 and the threshold voltage. In some embodiments, the comparator 310 generates a signal corresponding to a high voltage level (or logical 1) in response to the input voltage 313 drooping below the threshold voltage. The comparator 310 interrupts the droop detection signal in response to the input voltage 313 rising above the threshold voltage. Interrupting the droop detection signal includes decreasing an output voltage level to a low voltage level (or logical 0). The level-based droop detection circuit 305 therefore remedies many of the drawbacks in conventional droop detectors such as slope-based droop detectors. For example, the level-based droop detection circuit 305 only detects a droop in response to the currently measured value of the input voltage 313 falling below the minimum voltage, regardless of the rate at which the input voltage 313 is falling. For another example, the level-based droop detection circuit 305 does not require voltage averaging of the input voltage 313. For yet another example, the level-based droop detection circuit 305 does not require a clock signal and therefore does not "slow down" in response to a decrease in the frequency of the clock signal during a droop.

Some embodiments of the comparator 310 incorporate a bias so that the threshold voltage used to detect the droop is lower than the threshold voltage that is used to determine that the droop in the input voltage has ended. Furthermore, some embodiments of the level-based droop detection circuit 305 are configured to compare the input voltage to multiple threshold values (or multiple levels) to detect different types of droops. For example, first droops that occur on the order of nanoseconds may droop to a first voltage that is larger than a second voltage droop for second or third droops that occur on the order of microseconds or milliseconds. Implementing different threshold voltages in the voltage source 315 (e.g., using different voltage settings indicated by the signal 317) allows the comparator 310 to provide droop detection signals in response to different magnitudes of droop experienced during droops that occur on different timescales.

The signal generated by comparator 310 in the level-based droop detection circuit 305 is provided to a synchronization circuit 320 that provides variable length synchronization of the signal provided by the level-based droop detection circuit 305 with clock signals generated by a clock distribution network 325. The synchronization circuit 320 includes flip-flops 330, 331, 332, 333, 334, which are collectively referred to herein as "the flip-flops 330-334." Inputs to the flip-flops 330-334 are provided by other circuits such as synchronization signals generated by another clock domain, as discussed below. The synchronization circuit 320 also includes multiplexers 335, 336 that are able to selectively provide the droop detection signal at different delays that are generated by passing the droop detection signal through different subsets of the flip-flops 330-334.

A phase locked loop (PLL) 340 generates a fixed rate clock signal. Some embodiments of the phase locked loop 340 generate a square wave voltage signal that oscillates between a low voltage (or low phase) and a high voltage (or high phase) at a fixed frequency. A digital frequency synthesizer 345 is configured to provide a variable rate clock signal by modifying the fixed rate clock signal. For example, the digital frequency synthesizer 345 is able to generate the variable rate clock signal at a first frequency based on a first number of oscillations of the square wave voltage signal generated by the phase locked loop 340. The digital frequency synthesizer 345 receives the (potentially delayed) droop detection signal from the synchronization circuit 320. In response to the droop detection signal indicating that the level-based droop detection circuit 305 has detected a voltage droop, the digital frequency synthesizer 345 decreases the variable rate clock signal to a second frequency (lower than the first frequency) by increasing the number of oscillations in the fixed rate clock signal provided by the phase locked loop 340 that are used to generate the variable rate clock signal.

The variable rate clock signal generated by the digital frequency synthesizer 345 is provided to a stretch control unit 350, which controls conveying the variable rate clock signal to the clock distribution network 325. The variable rate clock signal is then distributed to entities within a processing system such as the processing system 100 shown in FIG. 1 by the clock distribution network 325. The entities that are able to receive the variable rate clock signal include processing units, memories, caches, and the like.

Figure 4:
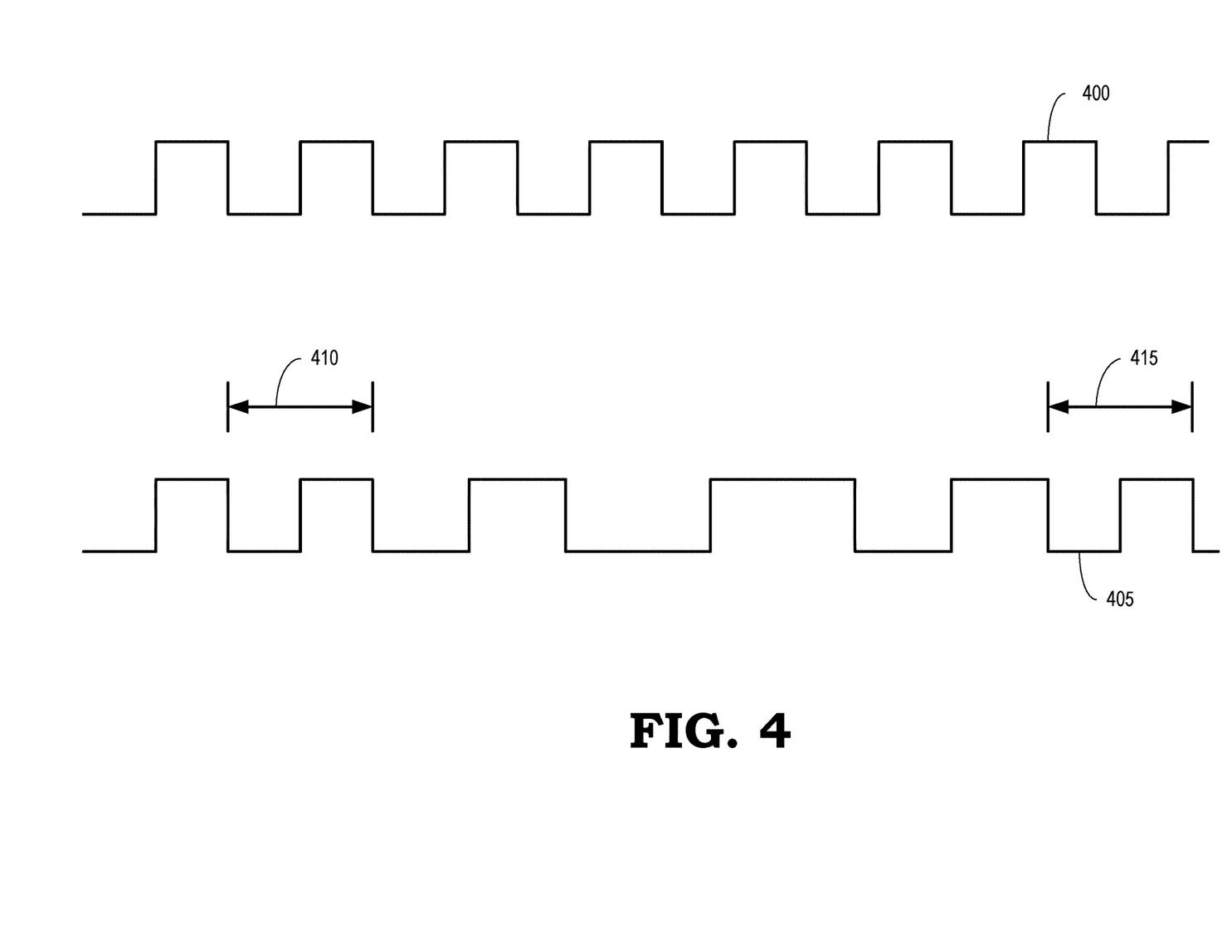
FIG. 4 illustrates a clock signal that is provided to entities within a processing system and a stretched clock signal that is provided to the entities within the processing system according to some embodiments.

FIG. 4 illustrates a clock signal 400 that is provided to entities within a processing system and a stretched clock signal 405 that is provided to the entities within the processing system according to some embodiments. The clock signal 400 and the stretched clock signal 405 are generated by some embodiments of the level-based droop detector 135 shown in FIG. 1 and some embodiments of the digital frequency synthesizer 345 shown in FIG. 3. The clock signal 400 is a square wave signal that oscillates between a low-voltage and a high-voltage, which are also referred to as a low phase and a high phase. The clock signal 400 oscillates at a first frequency that remains fixed over the duration of the clock signal 400 shown in FIG. 4.

The stretched clock signal 405 is also a square wave signal that oscillates between the low voltage/phase and the high-voltage/phase. The stretched clock signal 405 initially oscillates at the first frequency, e.g., the same frequency as the clock signal 400. In the illustrated embodiment, a level-based droop detector such as the level-based droop detector 135 shown in FIG. 1 and the level-based droop detector 300 shown in FIG. 3 detects a voltage droop on a power rail in the processing system during the time interval 410 corresponding to one oscillation of the stretched clock signal 405. The level-based droop detector generates a droop detection signal, which results in the digital frequency synthesizer decreasing (or stretching) the frequency of the stretched clock signal 405 to a second frequency that is lower than the first frequency. Stretching the frequency to the lower, second frequency slows down operation of entities that receive the stretched clock signal 405, such as a processing unit, to compensate for the lower voltages provided to the entities during the voltage droop. The level-based droop detector detects the end of the voltage droop in the time interval 415. In response to the voltage droop ending, the digital frequency synthesizer increases the frequency of the stretched clock signal 405, e.g., from the lower, second frequency back to the first frequency.

Figure 5:
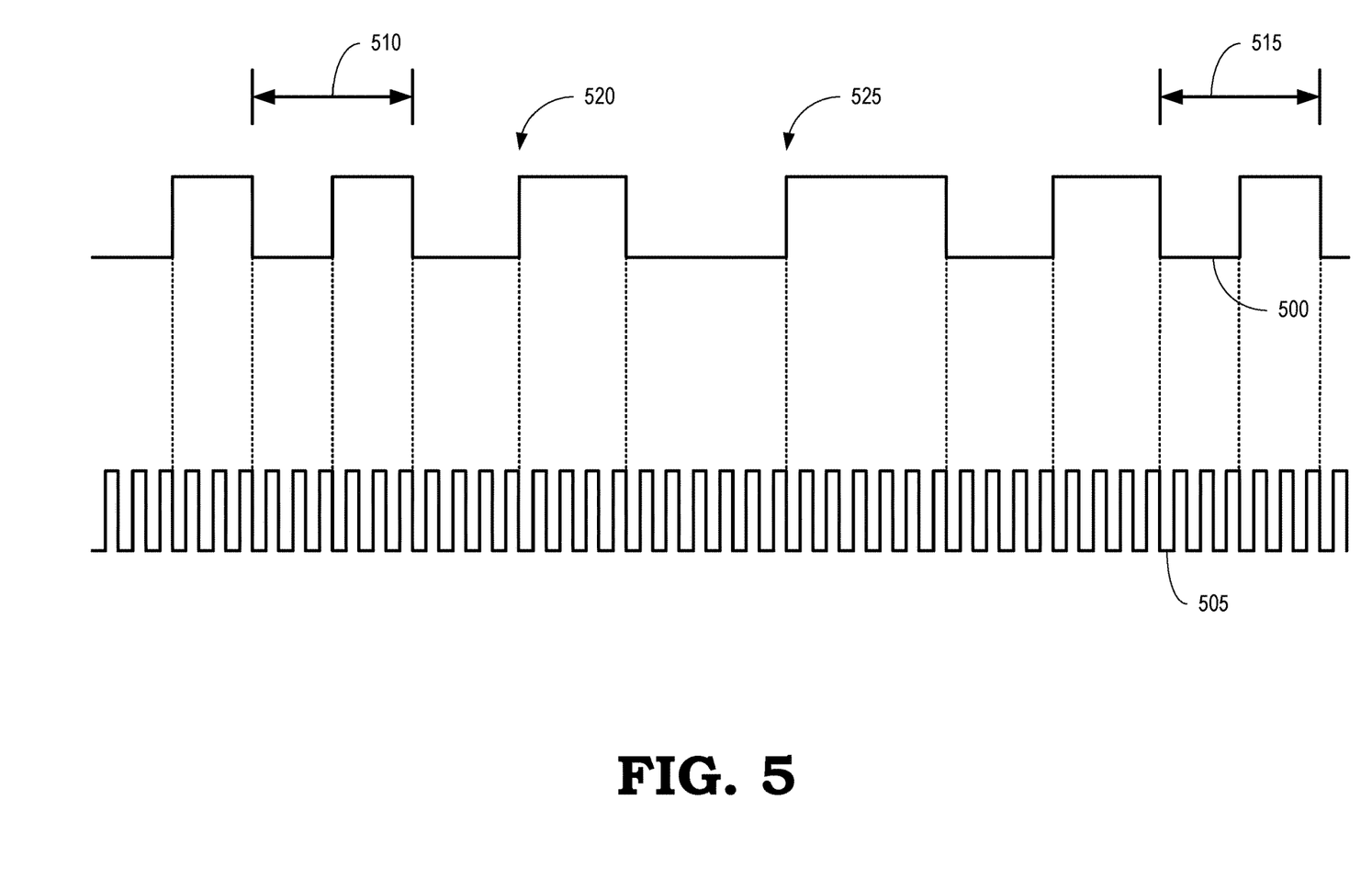
FIG. 5 illustrates a variable rate clock signal that is generated based on a fixed rate clock signal according to some embodiments.

FIG. 5 illustrates a variable rate clock signal 500 that is generated based on a fixed rate clock signal 505 according to some embodiments. The fixed rate clock signal 505 is generated by some embodiments of the phase locked loop 340 shown in FIG. 3 and the variable rate clock signal 500 is generated by some embodiments of the digital frequency synthesizer 345 shown in FIG. 3. The variable rate clock signal 500 represents some embodiments of the stretched clock signal 405 shown in FIG. 4. The fixed-rate clock signal 505 is a square wave signal that oscillates between a low voltage and a high voltage, which are also referred to as a low phase and a high phase. The fixed rate clock signal 505 oscillates at a first frequency that remains fixed over the duration shown in FIG. 5.

The digital frequency synthesizer generates the variable rate clock signal 500 by changing the number of phases of the fixed rate clock signal 505 that elapse during each oscillation of the variable rate clock signal 500. The digital frequency synthesizer is therefore able to increase or decrease a frequency of the variable rate clock signal 500 in response to changes in a droop detection signal, as discussed herein. In the illustrated embodiment, the variable rate clock signal 500 is a first frequency that corresponds to three cycles or oscillations of the fixed rate clock signal 505. A voltage droop is detected during the time interval 510 and, in response, the digital frequency synthesizer decreases the variable rate clock signal 500 by increasing the number of phases of the fixed rate clock signal 505 that elapse during each oscillation of the variable rate clock signal 500. For example, the variable rate frequency during the interval 520 corresponds to four cycles of the fixed-rate clock signal 505 and the variable rate frequency during the interval 525 corresponds to six cycles of the fixed rate clock signal 505. The end of the voltage droop is detected during the time interval 515 and, in response, the digital frequency synthesizer increases the variable rate clock signal 500 by decreasing the number of phases of the fixed rate clock signal 505 that elapse during each oscillation of the variable rate clock signal 500.

Figure 6:
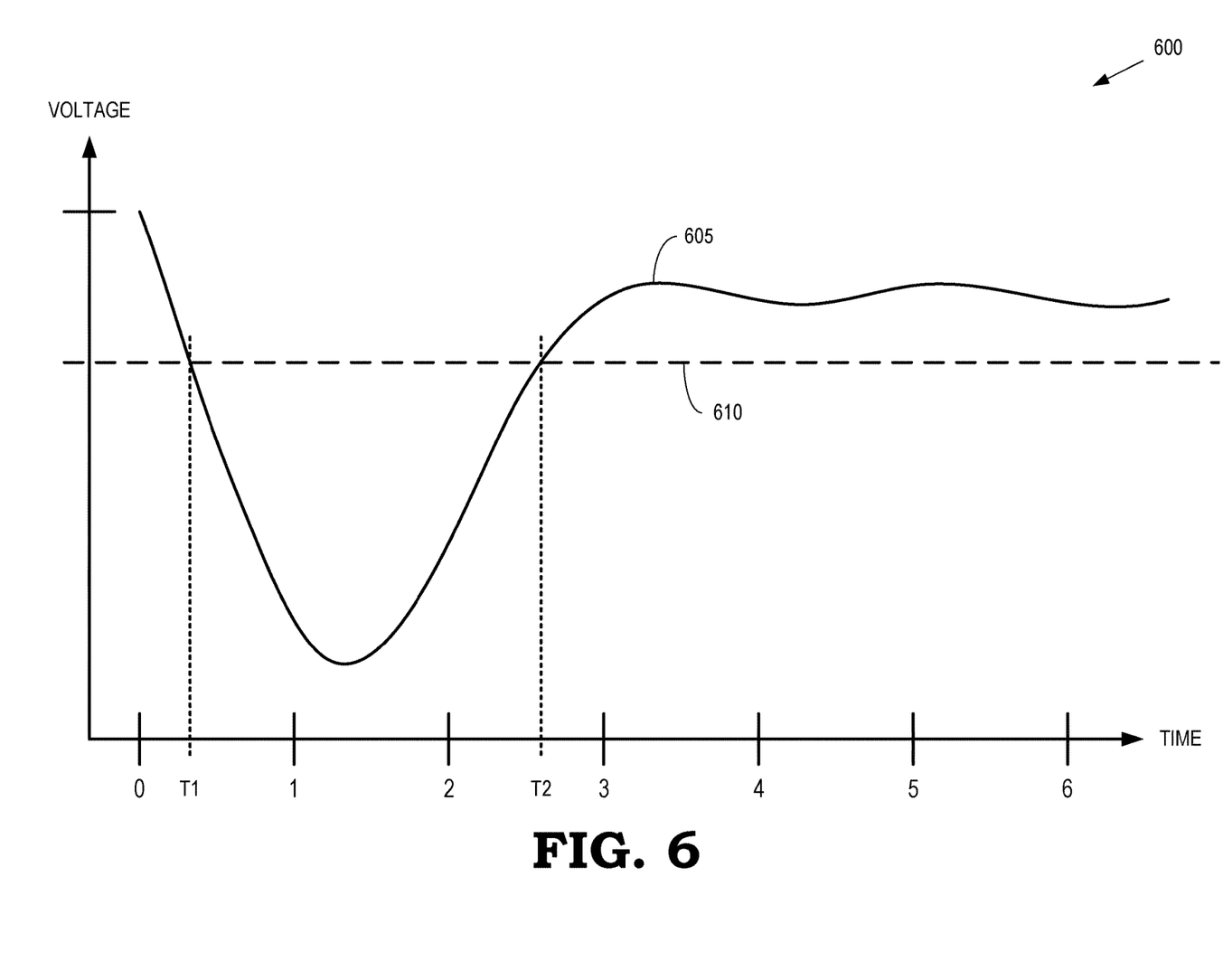
FIG. 6 is a plot of a voltage provided by a power regulator in response to an event that causes a processing unit to begin executing instructions according to some embodiments.

FIG. 6 is a plot 600 of a voltage provided by a power regulator in response to an event that causes a processing unit to begin executing instructions according to some embodiments. The plot 600 represents a voltage provided by some embodiments of the power regulator 120 shown in FIG. 1. The vertical axis indicates a voltage in arbitrary units and the horizontal axis indicates time in microseconds. A load step representing a change in a current drawn by the processing unit occurs at T=0 in the illustrated embodiment of the plot 600. The curve 605 represents a voltage supplied following the load step and the curve 605 indicates that a voltage droop occurs in response to the load step.

A level-based droop detector such as the level-based droop detector 135 shown in FIG. 1 or the level-based droop detection circuit 305 shown in FIG. 3 compares a voltage supplied by the power regulator to a threshold voltage 610. In the illustrated embodiment, the same threshold voltage 610 is used to establish the voltage level that is used to detect the beginning and the end of the voltage droop. However, some embodiments of the level-based droop detector use different threshold voltages (or a bias) to detect the beginning and the end of the voltage droop. For example, the level-based droop detector could use the threshold voltage of 610 to detect the beginning of the voltage droop and apply a positive bias to the threshold voltage 610 that is used to detect the end of the voltage droop to provide a hysteresis. The level-based droop detector detects the beginning of the voltage droop when the comparison indicates that the monitored voltage falls below the threshold voltage at the time T=T1. The level-based droop detector detects the end of the voltage droop when the comparison indicates that the monitored voltage rises above the threshold voltage at the time T=T2.

Figure 7:
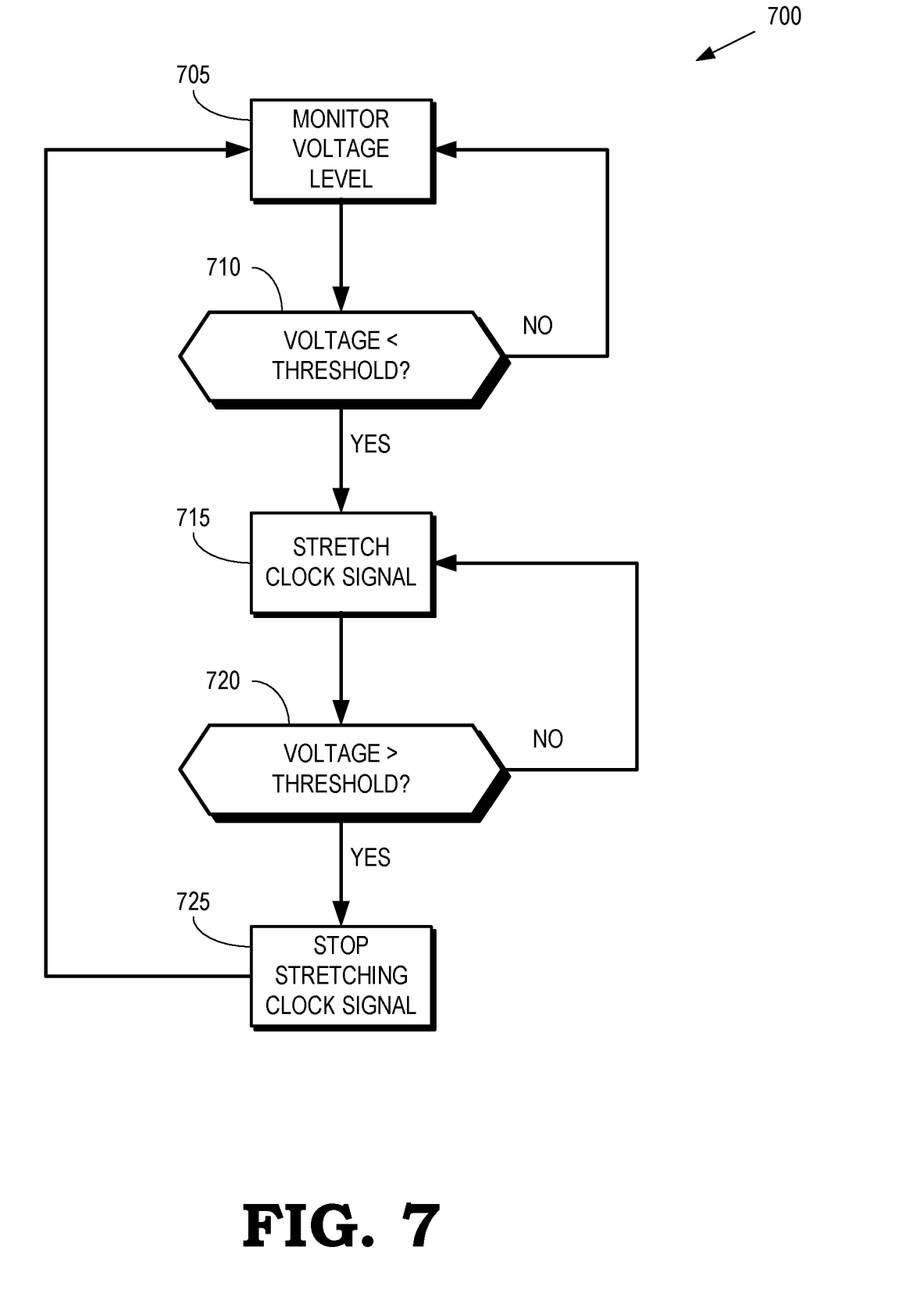
FIG. 7 is a flow diagram of a method of stretching a clock signal to compensate for a voltage droop according to some embodiments.

FIG. 7 is a flow diagram of a method 700 of stretching a clock signal to compensate for a voltage droop by a level-based droop detector according to some embodiments. The method 700 is implemented in some embodiments of the processing system 100 shown in FIG. 1 and the droop detection and mitigation circuit 300 shown in FIG. 3. The illustrated embodiment of the method 700 illustrates stretching of a clock signal in response to detecting a voltage droop based on a single voltage threshold. However, as discussed herein, some embodiments of the method 700 are used to stretch a clock signal based on multiple voltage thresholds, hysteresis biases, and the like.

At block 705, a level-based droop detector monitors a voltage level supplied by a power regulator such as the power regulator 120 shown in FIG. 1. Some embodiments of the level-based droop detector monitor the voltage level using a connection to a power rail that is also used to supply a voltage to other entities in the processing system such as a processing unit, a memory, a cache, and the like. The level-based droop detector is programmed to compare the monitored voltage level to a threshold voltage. The level-based droop detector is therefore implemented using some embodiments of the level-based droop detector 135 shown in FIG. 1 and the level-based droop detection circuit 305 shown in FIG. 3.

At decision block 710, the level-based droop detector determines whether the monitored voltage is less than the voltage threshold. If not, the method 700 flows back to block 705 and the level-based droop detector continues to monitor the voltage level supplied by the power regulator. If the monitored voltage is less than the voltage threshold, the method 700 flows to block 715.

At block 715, the level-based droop detector generates a droop detection signal and provides the droop detection signal to a clock distribution network to indicate that a voltage droop is occurring. In response to receiving the droop detection signal, the clock distribution network stretches the clock signal to decrease a frequency of the clock signal. Some embodiments of the clock distribution network include a digital frequency synthesizer (such as the digital frequency synthesizer 345 shown in FIG. 3) that stretches the clock signal by increasing a number of phases of a fixed rate clock signal generated by a phase locked loop (such as the phase locked loop 340 shown in FIG. 3).

At decision block 720, the level-based droop detector determines whether the monitored voltage is greater than the voltage threshold, which indicates that the power regulator has recovered from the voltage droop. If not, the method 700 flows to block 715 and the level-based droop detector continues to generate the droop detection signal so that the clock distribution network continues to stretch the clock signal. If the monitored voltage is greater than the voltage threshold, the method 700 flows to block 725.

At block 725, the level-based droop detector interrupts the droop detection signal or otherwise modifies the voltage of the droop detection signal to indicate that the voltage droop has been resolved. For example, the level-based droop detector can provide a droop detection signal at a lower voltage to indicate that the voltage droop has been resolved. In response to the interruption or modification of the droop detection signal, the clock distribution network stops stretching the clock signal. Some embodiments of the clock distribution network increase the frequency of the clock signal by decreasing the number of the phases of the fixed rate clock signal that correspond to each cycle or oscillation of the clock signal provided by the clock distribution network.

Figure 8:
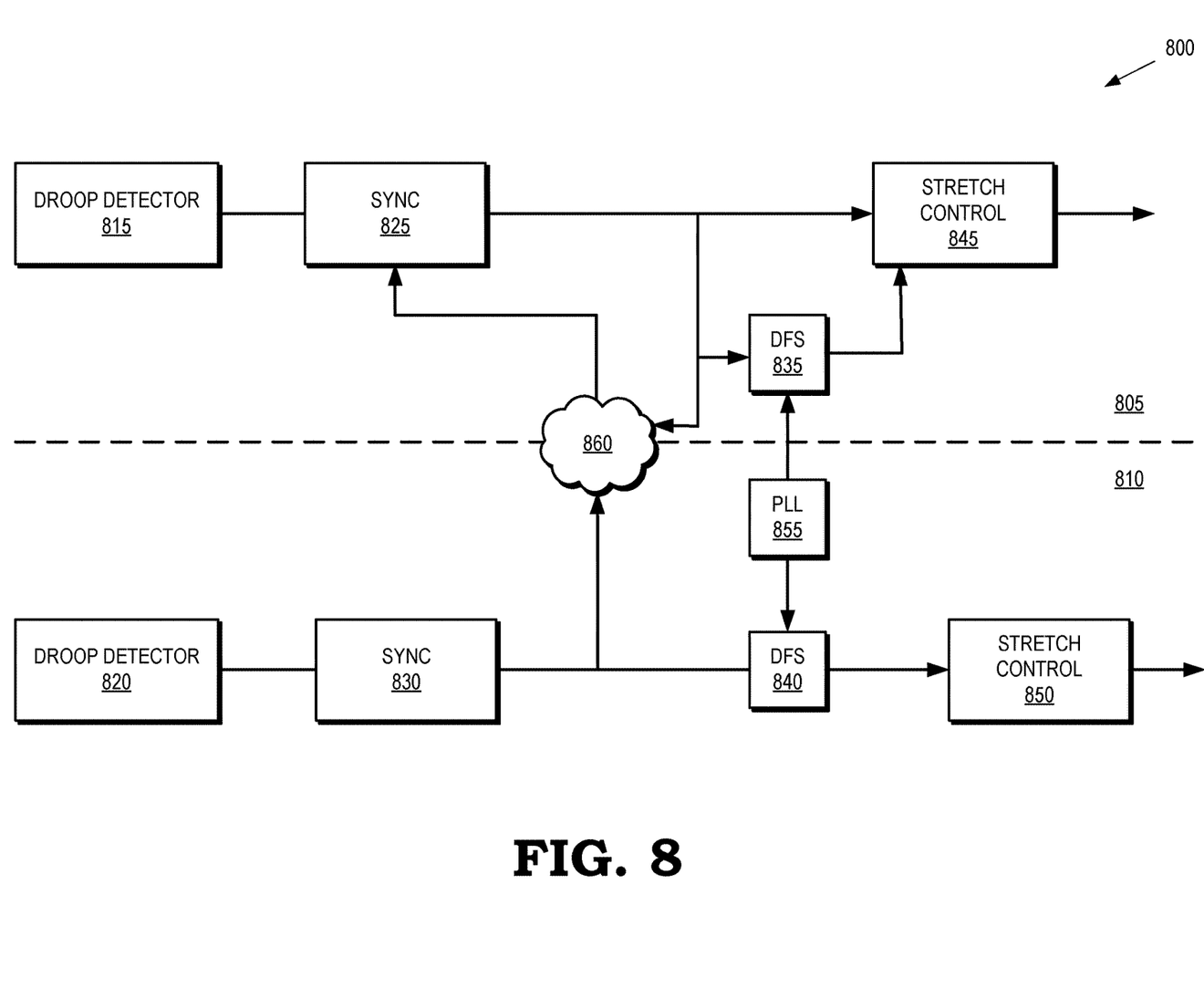
FIG. 8 is a block diagram of a processing system that includes circuits for droop detection and mitigation in separate power domains according to some embodiments.

FIG. 8 is a block diagram of a processing system 800 that includes circuits for level-based droop detection and mitigation in separate power domains 805, 810 according to some embodiments. Some embodiments of the power domain 805 include a processing unit such as the processing unit 115 shown in FIG. 1. Some embodiments of the power domain 810 include one or more caches that are used to cache data or instructions used by or generated by the processing unit in the power domain 805. The clock signals provided to the power domains 805, 810 are therefore subject to a constraint. For example, the frequency of the clock signal provided to the power domain 805 including the processing unit should be less than or equal to the frequency of the clock signal provided to the power domain 810 including the one or more caches.

Separate level-based droop detectors 815, 820 are disposed in the power domains 805, 810, respectively. The level-based droop detector 815 monitors a voltage supplied to the power domain 805 and the level-based droop detector 820 monitors a voltage supplied to the power domain 810. In some embodiments, the same voltage is supplied to the power domains 805, 810. However, different voltages are supplied to the power domains 805, 810 in other embodiments. The level-based droop detectors 815, 820 compare their monitored voltages to corresponding voltage thresholds, which are the same in some cases and different in other cases. Some embodiments of the level-based droop detectors 815, 820 include a voltage source and a comparator, such as the voltage source 315 and the comparator 310 shown in FIG. 3.

The power domains 805, 810 also include synchronization circuits 825, 830, digital frequency synthesizers 835, 840, and stretch control circuits 845, 850. These entities operate in the same or a similar manner to the corresponding entities in FIG. 3. In the illustrated embodiment, the digital frequency synthesizers 835, 840 generate variable rate clock signals based on a single fixed rate clock signal provided by a single phase locked loop 855. However, in other embodiments, the power domains 805, 810 include separate phase locked loops that provide fixed rate clock signals to the digital frequency synthesizers 835, 840 in the respective power domains 805, 810.

A synchronization network 860 is disposed between the synchronization circuits 825, 830 in the power domains 805, 810. The synchronization network 860 conveys a (potentially delayed) droop detection signal from the synchronization circuit 830 to the synchronization circuit 825, which uses the signal to enforce the constraint on the clock signals in the power domains 805, 810. In some embodiments, the clock signals are subject to the constraint that the frequency of the stretched clock signal in the power domain 805 is to be less than or equal to the frequency of the stretched clock signal in the power domain 810. This constraint is enforced by introducing the appropriate relative delays at the synchronization circuits 825, 830.

In some embodiments, the apparatus and techniques described above are implemented in a system including one or more integrated circuit (IC) devices (also referred to as integrated circuit packages or microchips), such as the droop detection and mitigation circuits described above with reference to FIGS. 1-8. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   in response to a voltage provided to a processing unit falling below a first threshold voltage,
   providing a droop detection signal to a synchronization circuit, the synchronization circuit configured to synchronize the droop detection signal with one or more clock signals generated by a clock distribution network and further configured to selectively provide the droop detection signal at different time delays; and
   in response to receiving the droop detection signal at the clock distribution network,
   decreasing a frequency of a variable rate clock signal provided to the processing unit by the clock distribution network.

2. The method of claim 1, further comprising:
   interrupting the droop detection signal to the clock distribution network in response to the voltage rising above a second threshold voltage different from the first threshold voltage; and
   increasing the frequency of the variable rate clock signal provided to the processing unit by the clock distribution network in response to interruption of the droop detection signal.

3. The method of claim 2, further comprising:
   in response to a plurality of droops in the voltage that occurred during different time intervals, providing and interrupting the droop detection signal a plurality of times.

4. The method of claim 3, wherein durations of the different time intervals range from nanoseconds to milliseconds.

5. The method of claim 1, further comprising:
   providing the variable rate clock signal at a first frequency prior to the clock distribution network receiving the droop detection signal; and
   providing the variable rate clock signal at a second frequency in response to the clock distribution network receiving the droop detection signal, wherein the second frequency is lower than the first frequency.

6. The method of claim 5, further comprising:
   providing the variable rate clock signal at the first frequency in response to interruption of the droop detection signal.

7. The method of claim 6, further comprising:
   in response to the clock distribution network receiving the droop detection signal, increasing a number of oscillations between high and low phases of a phase locked loop that generates the variable rate clock signal; and
   decreasing the number of oscillations between the high and low phases of the phase locked loop in response to interruption of the droop detection signal.

8. An apparatus comprising:
   a clock distribution network configured to provide a variable rate clock signal to a processing unit;
   a level-based droop detector configured to monitor a voltage of a current provided to the processing unit and provide a droop detection signal to the clock distribution network in response to the voltage falling below a first threshold voltage;
   a synchronization circuit configured to provide variable length synchronization of the droop detection signal with one or more variable rate clock signals generated by the clock distribution network and further configured to selectively provide the droop detection signal at different delays; and
   wherein the clock distribution network is configured to decrease a frequency of the variable rate clock signal provided to the processing unit in response to receiving the droop detection signal.

9. The apparatus of claim 8, wherein:
   the level-based droop detector is configured to interrupt the droop detection signal that is provided to the clock distribution network in response to the voltage rising above a second threshold voltage different from the first threshold voltage; and
   the clock distribution network is configured to increase the frequency of the variable rate clock signal provided to the processing unit in response to interruption of the droop detection signal.

10. The apparatus of claim 9, wherein the level-based droop detector comprises:
    a voltage source configured to generate the first threshold voltage; and
    a comparator configured to compare the first threshold voltage generated by the voltage source to the voltage provided to the processing unit, wherein the comparator is configured to generate the droop detection signal based on the comparison.

11. The apparatus of claim 8, wherein the level-based droop detector is configured to provide an interrupt in the droop detection signal a plurality of times in response to a plurality of droops in the voltage that occurred during different time intervals.

12. The apparatus of claim 11, wherein durations of the different time intervals range from nanoseconds to milliseconds.

13. The apparatus of claim 8, wherein the clock distribution network is configured to:
provide the variable rate clock signal at a first frequency prior to the clock distribution network receiving the droop detection signal; and
provide the variable rate clock signal at a second frequency in response to receiving the droop detection signal, wherein the second frequency is lower than the first frequency.

14. The apparatus of claim 13, wherein the clock distribution network is configured to provide the variable rate clock signal at the first frequency in response to interruption of the droop detection signal.

15. The apparatus of claim 14, wherein the clock distribution network comprises:
a phase locked loop to provide a fixed rate clock signal; and
a digital frequency synthesizer to provide the variable rate clock signal by modifying a fixed rate clock signal.

16. The apparatus of claim 15, wherein the digital frequency synthesizer is configured to provide the variable rate clock signal at the second frequency by increasing a number of oscillations between high and low phases of the phase locked loop in response to the clock distribution network receiving the droop detection signal.

17. The apparatus of claim 16, wherein the digital frequency synthesizer is configured to provide the variable rate clock signal at the first frequency in response to interruption of the droop detection signal by decreasing the number of oscillations between the high and low phases of the phase locked loop in response to interruption of the droop detection signal.

18. An apparatus comprising:
at least one clock distribution network configured to provide a first clock signal to a first clock domain in a first power domain and a second clock signal to a second clock domain in a second power domain;
a first level-based droop detector configured to monitor a voltage to the first power domain and provide a first droop detection signal to the clock distribution network in response to the voltage falling below a first threshold voltage;
a second level-based droop detector configured to monitor a voltage to the second power domain and provide a second droop detection signal to the clock distribution network in response to the voltage falling below a second threshold voltage;
wherein the at least one clock distribution network is configured to decrease a first frequency of the first clock signal provided to the first clock domain in response to receiving the first droop detection signal; and
wherein the at least one clock distribution network is configured to decrease a second frequency of the second clock signal provided to the second clock domain in response to receiving the second droop detection signal.

19. The apparatus of claim 18, further comprising:
a synchronization network configured to synchronize the first and second clock signals subject to a constraint.

20. The apparatus of claim 19, wherein the synchronization network is configured to synchronize the first and second clock signal such that the first frequency is less than or equal to the second frequency.

* * * * *